(12) United States Patent
Madigan et al.

(10) Patent No.: US 12,379,159 B2
(45) Date of Patent: Aug. 5, 2025

(54) SYSTEMS AND METHODS FOR DRYING PATTERNED OLED FORMULATIONS

(71) Applicant: Kateeva, Inc., Newark, CA (US)

(72) Inventors: Conor F. Madigan, San Francisco, CA (US); Alexander Sou-Kang Ko, Santa Clara, CA (US)

(73) Assignee: Kateeva, Inc., Newark, CA (US)

( * ) Notice: Subject to any disclaimer, the term of this patent is extended or adjusted under 35 U.S.C. 154(b) by 1024 days.

(21) Appl. No.: 16/519,724

(22) Filed: Jul. 23, 2019

(65) Prior Publication Data

US 2020/0028125 A1  Jan. 23, 2020

Related U.S. Application Data

(60) Provisional application No. 62/702,270, filed on Jul. 23, 2018, provisional application No. 62/812,143, filed on Feb. 28, 2019.

(51) Int. Cl.
  *H10K 71/00* (2023.01)
  *F26B 21/10* (2006.01)
  *H10K 71/40* (2023.01)

(52) U.S. Cl.
  CPC ............. *F26B 21/10* (2013.01); *H10K 71/00* (2023.02); *H10K 71/40* (2023.02)

(58) Field of Classification Search
  CPC .................................. H01L 51/56; F26B 21/10
  See application file for complete search history.

(56) References Cited

U.S. PATENT DOCUMENTS

| 3,935,646 | A | | 2/1976 | Grandine et al. |
| 4,347,302 | A | | 8/1982 | Gotman |
| 5,884,640 | A | * | 3/1999 | Fishkin ............. H01L 21/68728 134/95.2 |
| 10,115,900 | B2 | | 10/2018 | Madigan et al. |
| 2005/0132515 | A1 | * | 6/2005 | Boyd ................ H01L 21/67046 15/77 |

(Continued)

FOREIGN PATENT DOCUMENTS

| JP | 2003269859 A | | 9/2003 |
| JP | 2004184502 A | * | 7/2004 |

(Continued)

OTHER PUBLICATIONS

Notification of Transmittal of the International Search Report and the Written Opinion of the International Searching Authority, issued on Oct. 2, 2019 in PCT Application PCT/US19/42991.

(Continued)

*Primary Examiner* — Mohammad M Choudhry
(74) *Attorney, Agent, or Firm* — Hauptman Ham, LLP (57) ABSTRACT

A drying chamber for drying a substrate patterned with display areas wetted by OLED materials dissolved or suspended in a volatile carrier liquid and separated from one another by dry boundary regions. A mask adjusts drying rate of the carrier liquid during vacuum extraction using vapor-transmissive areas opposite the wet areas and vapor-barrier regions opposite the dry boundary regions, or by confining the wet areas collectively in a chamber volume small enough to quickly saturate with the carrier liquid before vacuum extraction.

13 Claims, 7 Drawing Sheets

(56) References Cited

U.S. PATENT DOCUMENTS

| | | | |
|---|---|---|---|
| 2007/0022952 A1* | 2/2007 | Ritchie | C23C 16/4402 |
| | | | 118/715 |
| 2015/0040822 A1* | 2/2015 | Olsen | C30B 25/186 |
| | | | 117/97 |
| 2017/0141310 A1* | 5/2017 | Madigan | H01L 51/56 |

FOREIGN PATENT DOCUMENTS

| | | | |
|---|---|---|---|
| JP | 2010169308 A | 8/2010 | |
| JP | 2018049806 A | 3/2018 | |
| KR | 20180033079 A | 4/2018 | |
| KR | 20180082498 A | 7/2018 | |
| WO | 2017087337 A1 | 5/2017 | |

OTHER PUBLICATIONS

CN Office Action dated Dec. 1, 2023 for CN Patent Application No. 201980048979.0.

JP Non-final Office Action dated Mar. 10, 2023 for JP Patent Application No. 2021-503173.

KR Office Action dated Nov. 15, 2023 for KR Patent Application No. 10-2021-7001706.

Second CN Office Action mailed Jul. 11, 2024 for CN Patent Application No. 201980048979.0.

KR Final Rejection dated Aug. 1, 2024 for KR Patent Application No. 10-2021-7001706.

* cited by examiner

SYSTEMS AND METHODS FOR DRYING PATTERNED OLED FORMULATIONS

CROSS-REFERENCE TO RELATED APPLICATIONS

This application claims benefit of U.S. Provisional Patent Application Ser. No. 62/702,270 filed Jul. 23, 2018, and to U.S. Provisional Patent Application Ser. No. 62/812,143 filed Feb. 28, 2019, each of which is incorporated by reference herein.

BACKGROUND

An organic light-emitting diode (OLED) is a light-emitting diode (LED) in which the light-emissive component comprises a layer or film of organic material. Display devices for e.g. televisions, computers, and mobile phones increasingly include arrays of tiny, individually controlled OLEDs as pixels.

OLED materials dissolved or suspended in a carrier liquid can be deposited on a substrate using inkjet technology. In a process analogous to printing text to paper, OLED pixels are "printed" on a suitable substrate by precisely placing drops of an OLED formulation in a desired pattern. A drying process then removes the carrier liquid from the deposited liquid to leave the OLED material.

Temperatures, flows, and pressures are precisely controlled during the drying process to remove the carrier liquid without physically distorting the pixels, and thus adversely impacting display quality. Precise control of pressure and temperature is difficult at the pixel scale, however. Pixel and display quality can thus vary over the display area. There is therefore a need for tools and methods for precisely and uniformly controlling the removal of carrier liquid from the deposited OLED materials.

BRIEF DESCRIPTION OF THE DRAWINGS

The detailed description is illustrated by way of example, and not by way of limitation, in the figures of the accompanying drawings and in which like reference numerals refer to similar elements and in which.

SUMMARY

Embodiments described herein provide a drying chamber comprising a substrate support disposed within an enclosure, the substrate support having a support surface; a mask having vapor-transmissive areas and vapor-barrier regions disposed across the support surface of the substrate support within the enclosure at an adjustable distance from the support surface; a gas source coupled to the enclosure; and a vacuum source coupled to the enclosure.

Other embodiments described herein provide a method for drying a substrate having wet areas wet with a carrier liquid separated by dry boundary regions, the method comprising orienting a mask relative to the substrate, the mask having vapor-transmissive areas and vapor-barrier regions; and drawing the carrier liquid from the wet areas of the substrate through the vapor-transmissive areas of the mask.

Other embodiments described herein provide a drying chamber comprising a substrate support to support a substrate having wet areas separated by dry boundary regions, the wet areas including a volatile carrier liquid that exhibits a carrier-liquid vapor pressure; a gas-distribution mechanism defining a process space of a process-space volume over the substrate, wherein the process-space volume approaches saturation of a vapor of the volatile carrier liquid within five minutes; and a vacuum source to draw the vapor of the volatile carrier liquid from the process space.

DETAILED DESCRIPTION

Figure 1:
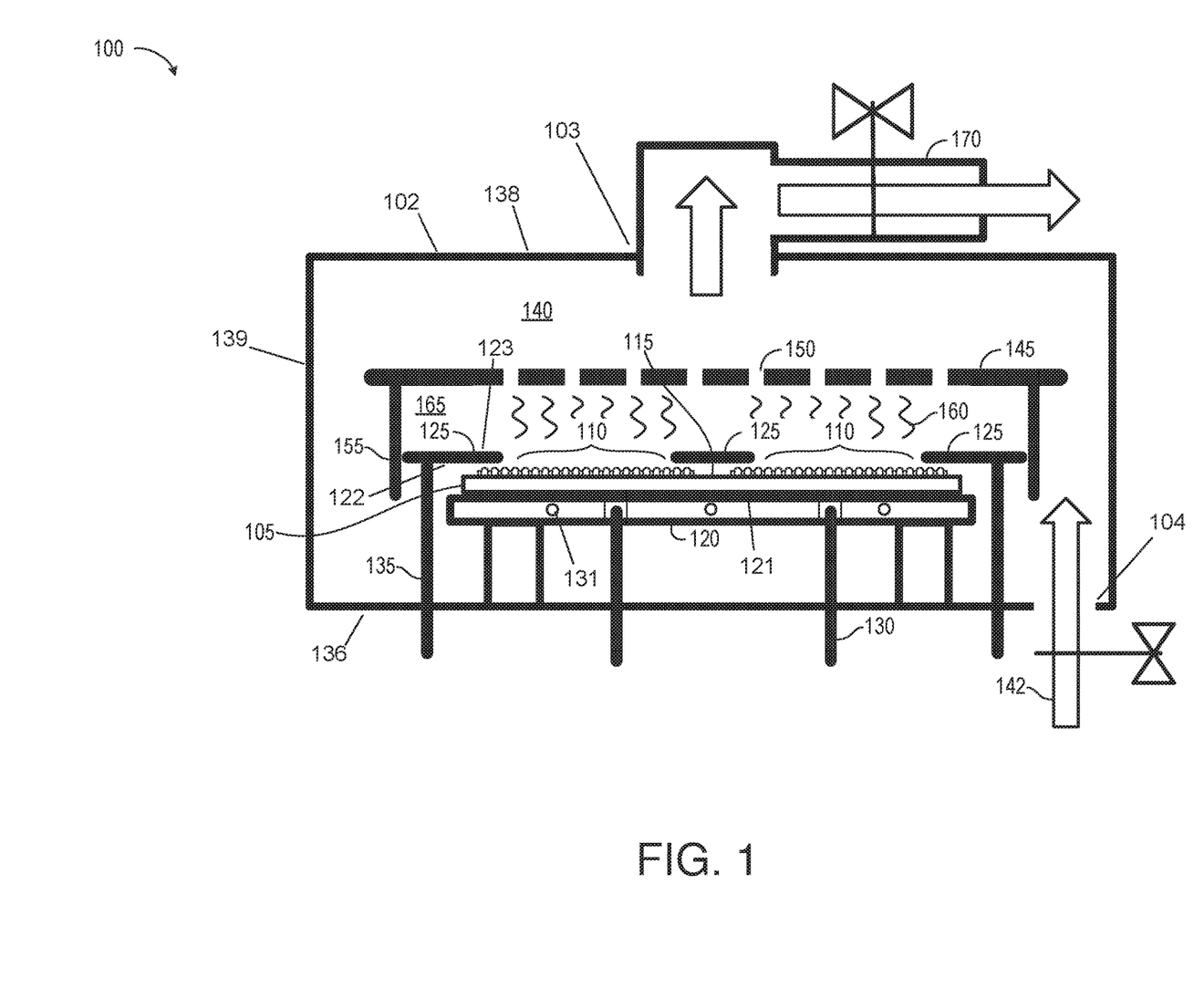
FIG. 1 depicts a drying chamber 100 for drying a substrate 105 that is patterned to include multiple display areas 110 separated by boundary regions 115.

FIG. 1 depicts a drying chamber 100 for drying a substrate 105 that is patterned to include multiple display areas 110 separated by boundary regions 115. Substrate 105 might be a large "mother glass," for example, upon which is deposited pixel arrays for a multitude of OLED displays. Boundary regions 115 may include e.g. drive electronics but are devoid of pixels. Display areas 110 are patterned with OLED materials dissolved or suspended in a volatile carrier liquid when substrate 105 is placed on a temperature-controlled support 120 within an enclosure 102 of chamber 100 to dry. Boundary regions 115 are devoid of pixels and thus of carrier liquid. The vapor concentration of the carrier liquid can therefore be relatively low above boundary regions 115. This uneven concentration over the surface of substrate 105 can cause pixels bordering boundary regions 115 to dry more quickly than interior pixels in display areas 110. Uneven drying can yield uneven pixel formation and thus diminished display quality. Where an ink layer that defines a pixel is desirably flat, for example, non-ideal drying conditions can produce mounded or depressed layers. Drying conditions that vary over an array of wet pixels can thus lead to visible and undesirable variations in pixel appearance.

A rigid mask 125 above substrate 105 is patterned to include vapor-transmissive areas opposite the wet display areas 110 and vapor-barrier regions opposite dry regions 115. The mask is a cover member that covers at least a portion of the substrate support 120 and is generally parallel to a support surface 121 of the substrate support 120. In this case, the support surface 121 and the mask 125 are generally planar in shape. The mask 125 has a proximate surface 122 that faces the support surface 121 and a distal surface 123 that faces away from the support surface 121. Here, both the proximate surface 122 and the distal surface 123 are parallel to the support surface 121, and in this case are both planar, but the distal surface 123 can be any convenient shape. The proximate surface 122 can be shaped to manage gas flow and evolution from the wet regions. Thus, the proximate surface 122 may be non-parallel to the support surface 121 in some respects to provide certain gas flow or vaporization characteristics, such as more or less vapor space for solvent fugacity, vapor flow, or vapor removal.

The vapor-barrier regions are sized and spaced relative to dry regions 115 to decrease the diffusion rate above edge pixels during the drying process. In the example of FIG. 1, the vapor-transmissive areas in mask 125 are centered over and somewhat smaller than the corresponding wet areas. The resulting overlap of mask 125 reduces the carrier-liquid diffusion rate near the edges of the wet areas, allowing the drying at the edges of the wet areas to proceed at the same rate as the drying more to the center of the wet area. The sizes of the vapor-transmissive areas and their spacing with respect to substrate 105 are selected to equalize the drying times of the edge and interior pixels. The gap between mask 125 and substrate 105 can be adjusted to increase or decrease the carrier-liquid diffusion rate at the edge pixels, and thus to adjust edge-pixel drying times.

The vapor-transmissive areas are shown here as large openings in the mask 125 juxtaposed with the display areas 110. In such cases, the openings will have shapes related to the shapes of the display areas 110. The covered edges of the display areas 110 have dimensions related to the desired difference in drying rate between the covered and uncovered areas of the display areas 110. Width of one covered edge of a display area 110, in a direction along a width axis of the edge, may be from 1-10% of the total width of the display area 110 in the direction along the width axis of the edge, depending on the edge width expected to be affected by accelerated edge drying. It should be noted that, in some cases, space between adjacent display areas 110 may be small enough that atmospheric compositional variation between wet and dry zones is not significant enough to cause edge drying acceleration. In such cases, the edges adjacent to such small dry spaces would not need to be covered to adjust drying rate. Depending on the composition of the material of the display areas 110 to be dried, a dry zone between display areas 110 that has dimension, in the direction along the width axis, less than 1% of the dimension, in the direction along the width axis, of the display area 110 is small enough in some cases to avoid the need for edge drying rate adjustment for those edges adjacent to the dry zone. In such cases, an opening, as shown here, may extend across more than one display area 110.

Rather than openings, a mesh, screen, or porous material can be used to form vapor-transmissive areas. Mesh, screen, porous materials, and openings can be used together in combinations to afford specific flow patterns through the mask 125 as needed. Additionally, or instead, a vapor-transmissive area may utilize multiple openings. In all these cases, the vapor-transmissive area will generally have a material through which multiple openings of one sort or another are formed. This material will extend from side to side of the vapor-transmissive area, connecting with a border area of the mask 125. The material of the vapor-transmissive area may have a thickness that is the same as, or different from, a thickness of the border area. For example, the material of the vapor-transmissive area, though which openings and/or passages are formed, may have a thickness that is less than the thickness of the border area. In other words, the vapor-transmissive area may be a recessed area of the mask through which multiple openings or passages of one sort or another are formed.

Chamber 100 includes lift pins 130 to facilitate substrate placement and removal. Substrate support 120 can be vertically actuated to adjust the spacing between substrate 105 and mask 125. Mask 125 can likewise be actuated via mask supports 135. Actuators (not shown) for manipulating these adjustable elements can be located outside the volume 140 of chamber 100. The mask supports 135 may be along two opposite sides of the mask 125, and may be attached to a frame (see FIG. 5) that can be used to support the mask 125. Locating the supports 135 along two opposite sides of the mask 125 enables placement and retrieval of substrates on the substrate support 120 between the substrate support 120 and the mask 125. The mask supports 135 extend through a floor 136 of the enclosure 102 to a location outside the enclosure 102 where the mask supports 135 can be actuated, for example using a linear actuator (not shown).

An external gas source 142 introduces an inert gas under closed-loop control that, with a vacuum source 170, maintains a desired pressure profile within volume 140 during a drying process. The vacuum source 170 is coupled to an interior of the enclosure by a vacuum port 103, and the external gas source is coupled to the interior of the enclosure by a gas port 104. These ports are shown located in opposite walls of the enclosure 102, but can be at any convenient location. Other gases, such as clean, dry air optionally treated to remove ozone, may also be used. Temperatures of volume 140, support 120, and other elements of chamber 100 may also be subject to closed-loop control over heating, cooling, or both. Carrier liquids can thus be evaporated from wet areas 110 driven by both pressure and temperature. Mechanisms for controlling temperature and pressure are well known to those of skill in the art so a detailed treatment is omitted. Interested readers are directed to US Patent Publication 2017/0141310, which is incorporated herein by reference.

A mobile or stationary gas-distribution element 145 with holes 150 and an area-selective, peripheral vapor barrier 155 encompassing a gap between mask 125 and gas-distribution element 145 is optionally included to guide an even flow of vapor 160 from wet regions 110. Vapor barrier 155 serves both to minimize vapor diffusion out of a region 165 above substrate 105 and reduce inflow of gas that may disturb the flow or distribution of vapor 160. During a drying operation a vacuum source 170 draws vapor 160 of the carrier liquid from wet areas 110 through the vapor-transmissive areas of the mask. Though not shown, some embodiments include e.g. a temperature-controlled or passive condensation plate to trap vapors 160 above gas-distribution element 145. Here, the gas source 142 generally provides a gas flow into the enclosure 102 and around and outside the vapor barrier 155, as shown in FIG. 1, but the gas source 142 can be provided at any convenient location along the floor of the enclosure 102 or in a sidewall of the enclosure 102.

The gas-distribution element 145 may have holes of uniform size and spacing or varied size and spacing. For example, smaller holes and/or more widely distributed holes near the edge can incrementally increase gas pressure near the edge of the gas-distribution element 145, and near the edge of the mask 125, to incrementally affect drying conditions at the edge of the mask 125. Rather than holes, a mesh or screen can also be used in the gas-distribution element 145.

The mask supports 135 can alternately extend through a ceiling 138 or a sidewall 139 of the enclosure 102, according to the convenience of locating one or more actuators to move the gas supports 135. If necessary, the mask supports 135 could be disposed through the gas-distribution element 145 and through the ceiling 138, or the mask supports 135 could be routed around the gas-distribution element 145.

Mask 125 is made of a low-outgassing material sufficiently rigid to maintain a uniform gap of e.g. a few millimeters above substrate 105 without contacting the substrate. Stainless steel, aluminum, or titanium are non-limiting examples that are suitable. Rigid plastic materials can also be used. Gas source 142 provides a controlled flow of e.g. nitrogen, argon, or purified air and can be controlled to maintain specified maximum concentrations of these and other gases. The drying of wet regions 110 during a drying cycle is controlled by managing the temperature of substrate 105 by adjusting the temperature of the support 120, for example using heating and cooling elements 131 within the support 120, managing the pressure and gas composition within chamber volume 140, and managing the gap between the mask 125 and substrate 105. The heating and cooling elements 131 can be resistive or conductive, for example heating coils or tubing to carry heating or cooling fluids. Those of skill in the art can empirically derive preferred combinations of these process parameters, any or all of which can change during a drying cycle, for a given substrate. Though not shown, as noted above, substrate support 120 and other elements can include temperature-control elements for heating and cooling substrate 105, and for maintaining substrate 105 at a constant temperature or desired temperature profile.

Figure 2:
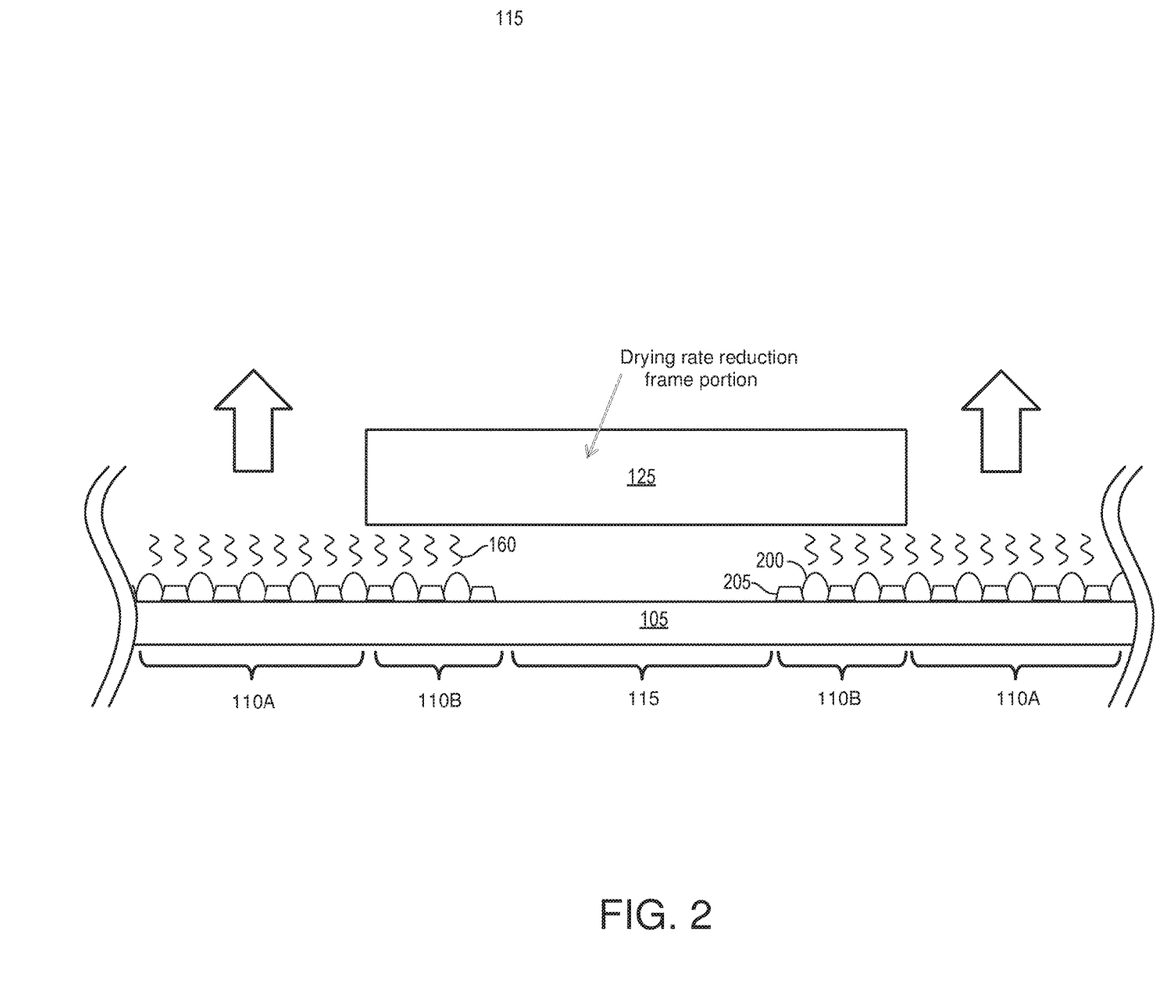
FIG. 2 details portions of substrate 105 and mask 125 introduced in FIG. 1.

FIG. 2 details portions of substrate 105 and mask 125 introduced in FIG. 1. Wet areas 110 are divided into central areas 110A and edge areas 110B, all of which include pixels of wet OLED formulation, or "ink," 200 confined within ink wells 205. The illustrated portion of frame 125 overlaps edge area 110B to maintain the vapor concentration above the edge pixels at or near the vapor concentration above central areas 110A. Edge areas 110B may extend beyond the area required for the function of the device being manufactured, the additional peripheral pixels serving as vapor sources improving the function of more interior neighbors. These sacrificial, or "dummy" pixels, are not active in producing images on the display.

Figure 3:
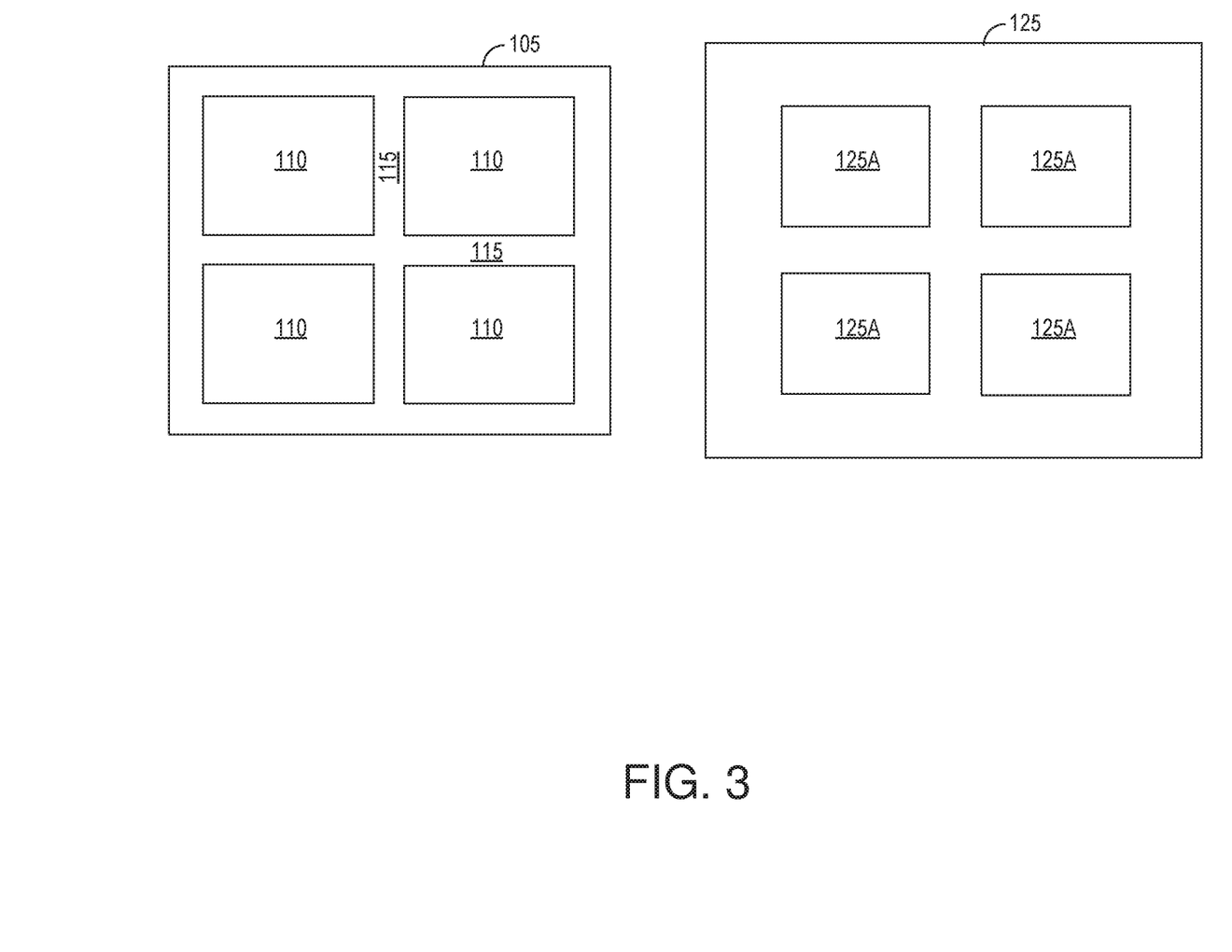
FIG. 3 shows plan views of substrate 105 and mask 125.

FIG. 3 shows plan views of substrate 105 and mask 125 of FIGS. 1 and 2. Apertures 125A in mask 125 and wet regions 110 are geometrically similar in this example and mask 125 is otherwise tailored to substrate 105. Mask 125 can be easily removed from chamber 100 and replaced with a bespoke mask for a differently patterned substrate. Replaceable, substrate-specific masks are simple and inexpensive relative to more significant modifications required for improved drying uniformity across diverse substrates.

Figure 4:
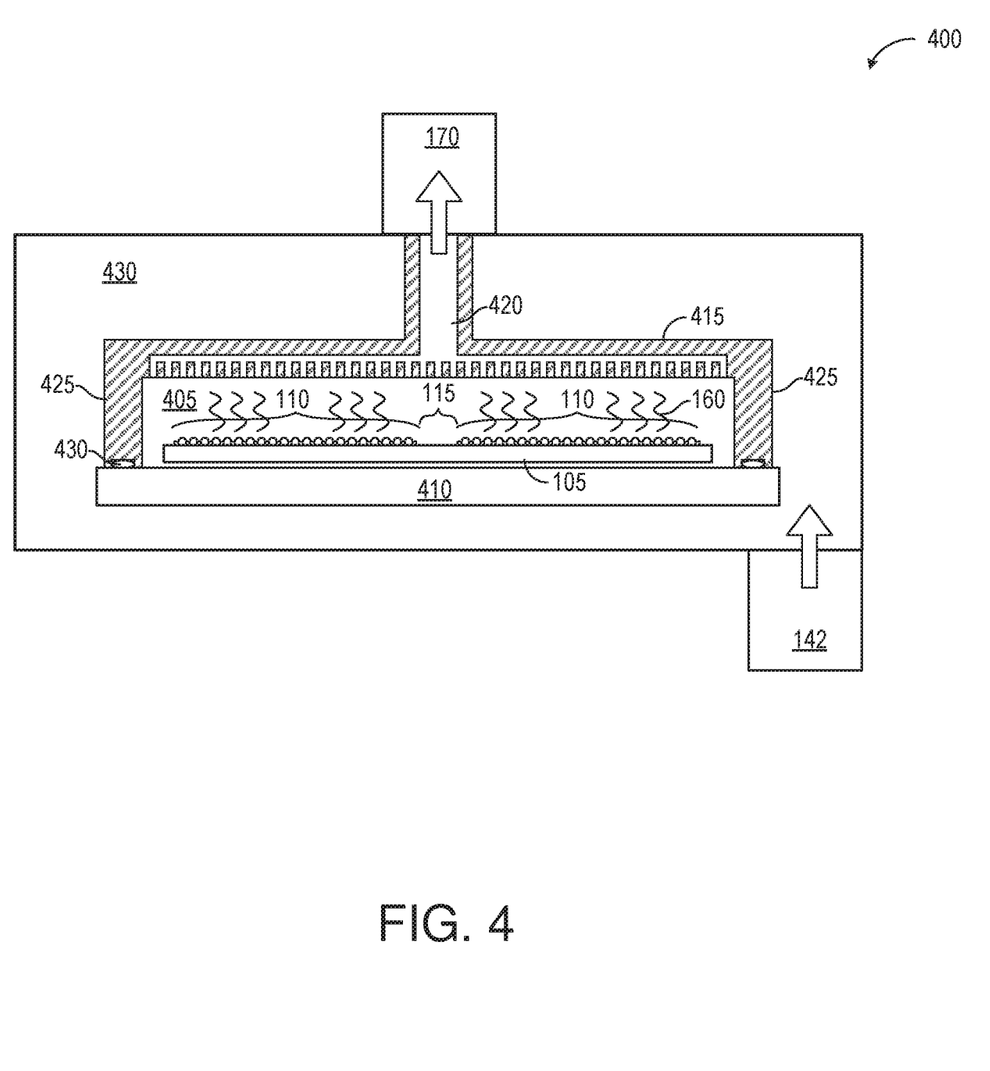
FIG. 4 details a drying chamber 400 in accordance with another embodiment.

FIG. 4 details a drying chamber 400 in accordance with another embodiment. Drying chamber 400 is in some ways similar to chamber 100 of FIG. 1 with like-identified elements being the same.

Drying chamber 400 seals substrate 105 within a process space 405 defined by a substrate support 410 and a gas-distribution mechanism 415, such as a reverse showerhead, that incorporates channels 420 and a peripheral boundary 425. One or both of support 410 and mechanism 415 are vertically actuated to facilitate substrate admission and removal. A secondary process space 430 can be filled with e.g. an inert gas or clean, dry air. A seal 432, such as via an O-ring, prevents the communication of that gas with the contents of process space 405 during a drying process. Access to process space 405 can be provided e.g. via a side door or aperture in other embodiments.

Chamber 400 improves drying uniformity by equilibrating carrier-liquid vapor concentrations over substrate 105. The volume of space 405 is confined so that the evaporating carrier liquid, illustrated here as vapor 160, reaches saturation in less than five minutes. The vapor concentration near saturation is equilibrated over wet areas 110 and dry regions 115, and thus diminishes the disparate drying of edge pixels relative to central pixels. The volume of space 405 is defined as a function of the carrier-liquid vapor concentration and will be different for different solvents, pressures, and temperatures. The cross section of FIG. 4 is not to scale. In an embodiment in which substrate 105 is nine square meters, for example, the perforated underside of mechanism 415 can be within a few millimeters above the substrate.

Drying is accomplished by allowing the vapor concentration within space 405 to approach equilibrium before evacuating space 405 by application of low pressure via vacuum source 170. In one embodiment the process variables are established such that the volatile carrier liquid is within 90% of saturation in process space 405 before initiating vapor extraction. Vapor 160 is extracted quickly due to the low volume of space 405. Rapid extraction limits the impact of neighboring pixels on drying times, and thus reduces malformations of edge pixels. A vapor mask of the type detailed above can be included within space 405 in other embodiments. The pattern of holes in gas-distribution mechanism 415 can also be modified to preferentially pull vapor from wet areas 110.

Figure 5:
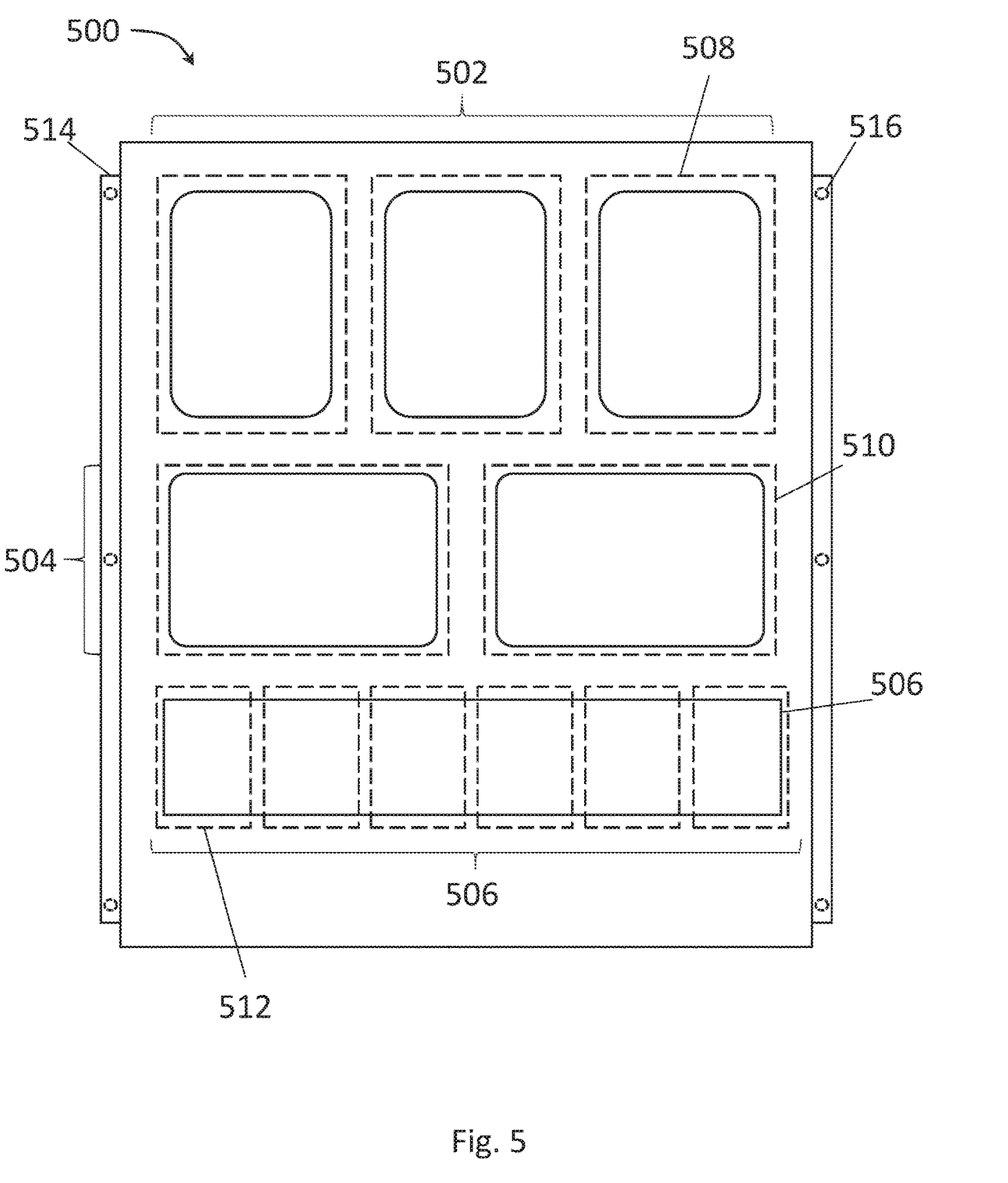
FIG. 5 is a plan view of a mask according to one embodiment.

FIG. 5 is a plan view of a mask 500 according to one embodiment. The mask 500 can be used to adjust drying profile of a substrate having wet regions to be dried in a drying apparatus such as the apparatus 100 of FIG. 1. The mask 500 has a plurality of first apertures 502, a plurality of second apertures 504, and a single third aperture 506. The first plurality of apertures 502 is for masking a first plurality of wet regions 508 on a substrate, here represented in phantom. The second plurality of apertures 504 is likewise for masking a second plurality of wet regions 510. The third aperture 506 is likewise for masking a third plurality of wet regions 512.

The apertures of the first plurality of apertures 502 have a first size and a first shape. The apertures of the second plurality of apertures 504 have a second size and a second shape. The third aperture 506 has a third size and a third shape. Here, the first, second, and third sizes are all different, and the first, second, and third shapes are all different. The shapes are all generally rectangular, but the first and second shapes have rounded corners, whereas the third shape has normal, right-angle corners. Here, the second size is larger than the first size. The first shape has rounded corners with a first curvature radius, while the second shape has rounded corners with a second curvature radius that is less than the first curvature radius.

The first plurality of apertures 502 has a first spacing between the apertures, and the second plurality of apertures 504 has a second spacing between the apertures that is different from the first spacing. The spacing between the apertures is generally driven by the spacing between the wet regions and the edge coverage of the apertures. The edge coverage of the apertures, as explained elsewhere, is determined based on the drying adjustment needed for edge regions relative to central regions. Here, the perimeter of each first and second aperture, when projected onto a substrate suitably positioned below the mask 500, as shown in FIG. 5, lies entirely within and concentric with a corresponding wet region to be dried. Thus, edge coverage is symmetrical on all four sides of each wet region. It should be noted that, although the geometries shown in the figures of this application are generally rectangular, the same concepts can be applied to other geometries, for example general polygons, general ellipses and circles, and irregular shapes.

The third aperture 506 masks the edge of a plurality of wet regions of the substrate that are separated one from the other by a small dry zone that is small enough not to need masking for drying rate adjustment. Thus, the third aperture 506 masks edges of the wet regions adjacent to large dry zones. For this reason, one aperture masks a plurality of wet regions.

The aperture sizes, shapes, and arrangements shown in FIG. 5 are intended to illustrate concepts of drying mask structure that can be used in any combination in a single mask. The apertures of a single mask can have the same shape or all different shapes, which may be generally rectangular or a mix of shapes. Sizes and spacings can likewise be all the same or all different in any combination.

The mask 500 of FIG. 5 is shown coupled to a frame 514 that supports the mask 500 and allows for manipulation of the mask 500. The frame is supported on supports 516 shown in phantom because they are below the frame 514 and not directly visible in the plan view of FIG. 5. The supports 516 are generally similar to the mask support 135 described in connection with FIG. 1. The supports 516 are on two opposite sides of the mask 500 to facilitate substrate placement and retrieval from an end of the mask 500 between the sides coupled to the frame 514.

Figure 6:
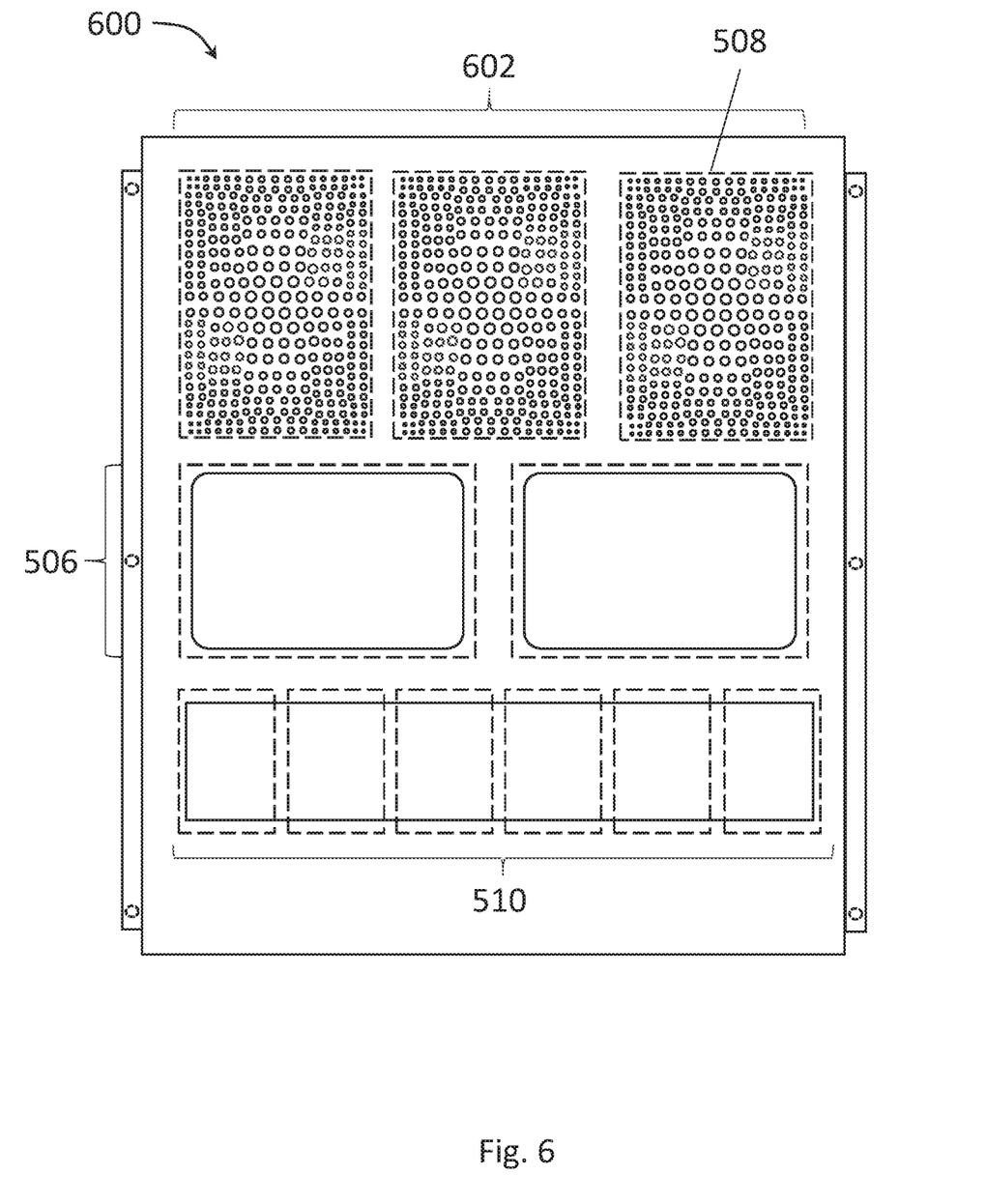
FIG. 6 is a plan view of a mask according to another embodiment.

FIG. 6 is a plan view of a mask 600 according to another embodiment. The mask 600 uses multiple apertures for drying adjustment of certain wet regions. Specifically, the mask 600 uses multiple apertures to form vapor-transmissive regions for the first plurality of wet regions 508. A plurality of vapor-transmissive regions 602 is used to mask the first plurality of wet regions 508 in the mask 600. Each vapor-transmissive region 602 has apertures of multiple different sizes generally increasing toward a central area of the vapor-transmissive region 602 to equalize drying rate from the edge to the center of the wet regions 508. The apertures are irregularly spaced but generally produce a trend of increasing flow cross-section through the mask from edge to center. Here, small openings are used near the edges of the vapor-transmissive region 602, and larger openings are used near the center of the vapor-transmissive region 602. The size of the openings generally increases monotonically, optionally linearly, from the edge to the center of the vapor-transmissive region 602. The smallest openings, in this case, are near the corners of the vapor-transmissive region 602, since areas of the wet region 508 near the corners are surrounded by the most dry area and will be subject to the fastest drying conditions.

The mask 600 is an embodiment that uses different kinds of vapor-transmissive features. Here, we have vapor-transmissive regions comprising multiple openings included with vapor transmissive regions comprising a single opening. We also have single-opening vapor transmissive regions that cover a single wet region included with a vapor-transmissive region that covers multiple wet regions. Different kinds of vapor-transmissive regions can be used in a single mask. The kinds of vapor-transmissive regions include those shown in FIG. 6, along with porous materials, slotted materials, etched materials having tortuous passages formed through a solid material, sintered materials, and other transmissive materials.

Figure 7A:
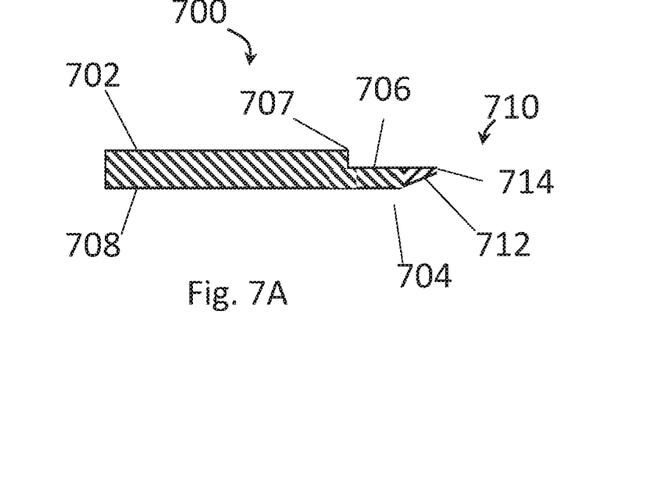
FIGS. 7A-7C are cross-sectional views of portions of masks according to different embodiments.
Figure 7B:
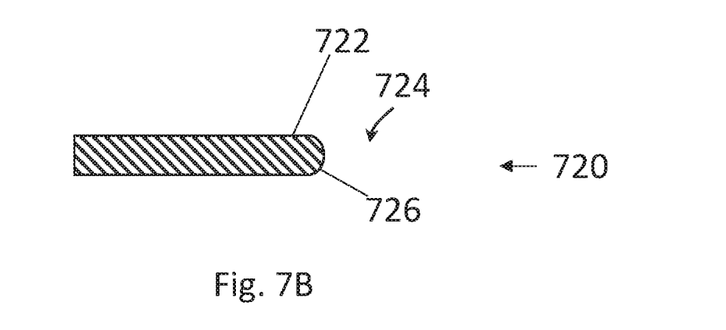

FIG. 7A is a cross-sectional view of a portion of a mask 700 that can be used with an of the apparatuses described herein. This view is a portion of the mask 700 at the edge of an opening that forms at least part of a vapor-transmissive area of the mask 700. The mask 700 has a border area 702 that is generally disposed over a dry zone of an underlying substrate, and a vapor-transmissive region 704 that is recessed at a distal surface 706 of the mask 700. The vapor-transmissive region 704 thus connects with the border area 702 at an outer wall 707. The vapor-transmissive region 704 can alternately be recessed at a proximate surface 708 of the mask 700 opposite from the distal surface 706. The vapor-transmissive region 704 has at least one opening 710. An edge 712 of the opening is tapered in this case to achieve a desired evaporation profile for the portion of the substrate covered by the vapor-transmissive region 704. The taper ends in a thin flat wall 714 around the opening 710. Here, the taper is linear, for example a bevel, and the tapered region has a dimension that is less than a dimension of the vapor-transmissive region 704 from the outer wall 707 to the wall 714 of the opening 710. The tapered region can be curved, and can extend any desired distance from the wall 714 away from the opening 710. In some cases, the tapered region can extend beyond the outer wall 707 to a location under the border area 702. Here, the taper is applied on the proximate surface 708 of the mask 700, but a taper can be applied, alternately or additionally, to the distal surface 706 of the mask 700. FIG. 7B is a cross-sectional view of a portion of a mask 720 according to another embodiment. Here, a vapor-transmissive region 722 has an opening 724 that has a curved edge 726 forming a wall around the opening 724. The curved edge 726 is elliptical here, but could be any desired shape, including parabolic or hyperbolic, to influence gas flow at the edge. FIGS. 7A and 7B are examples included to demonstrate that different edge effects can be applied to openings in the vapor-transmissive regions of the various masks described herein. Each opening in a single vapor-transmissive region can have an edge effect that is different from every other opening, if desired. A single opening can have an edge effect that varies around the opening. For example, a single opening in a vapor-transmissive region of any of the masks described herein can have a tapered edge where the taper angle or shape varies, continuously or discontinuously, around the circumference of the opening. Such an opening can have an edge effect only at a portion of the opening, with the rest of the opening edged by a simple vertical flat wall. Edge effects can also be used with mesh and porous material vapor-transmissive regions where the mesh or porous material meets the border area of the mask.

Figure 7C:
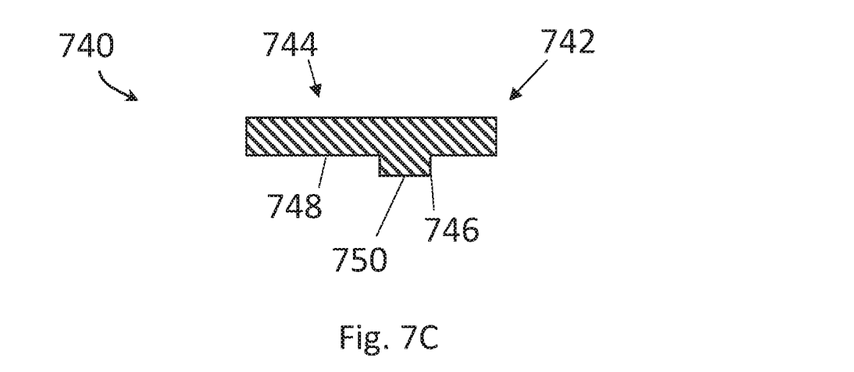

FIG. 7C is a cross-sectional view of a portion of a mask 740 according to another embodiment. Here, a vapor-transmissive region 742 is surrounded by a border area 744, and a wall 746 extends from a proximate surface 748 of the mask 740 toward the support surface of the substrate support. The wall 746 has a flat end 750 that faces the support surface forming a gap between the flat end 750 and the support surface to reduce a gas flow cross-section along the flat end 750 of the wall 746. The wall can extend from the proximate surface 748 in the vapor-transmissive region 742 or the border area 744, or may overlap from the vapor-transmissive region 742 to the border area 744. The wall 746 can extend around the entire periphery of an opening of the vapor-transmissive region 742 to provide a partial seal around the wet regions of the substrate. The wall can also extend around the periphery of the entire vapor-transmissive region 742. The wall can also extend partway around an opening, or the entire vapor-transmissive region. The partial seal reduces the drying acceleration effect from dry zones adjacent to the wet regions by reducing the opportunity for peripheral removal of solvent-bearing gas to accelerate evaporation along the edge of the wet region. It should be noted that the wall 746 can have a curved end rather than the flat end 750.

While the subject matter has been described in connection with specific embodiments, other embodiments are also envisioned. For example, while mask 125 of FIG. 1 includes a single aperture for each wet region 110, different numbers, shapes, and patterns of apertures can be used to maintain relatively uniform vapor concentrations in other embodiments. Therefore, the spirit and scope of the appended claims should not be limited to the foregoing description.

Only those claims specifically reciting "means for" or "step for" should be construed in the manner required under the sixth paragraph of 35 U.S.C. § 112.

What is claimed is:

1. A drying chamber comprising:
   a substrate support disposed within an enclosure, the substrate support having a support surface;
   a gas source coupled to the enclosure;
   a vacuum source coupled to a ceiling of the enclosure;
   a movable mask having vapor-transmissive areas and vapor-barrier regions disposed across the support surface of the substrate support within the enclosure and spaced apart from a ceiling of the enclosure to provide an adjustable distance between the mask and the support surface; and
   a gas distribution element disposed between the mask and the vacuum source, the gas distribution element comprising a vapor barrier surrounding a gap between the mask and the gas distribution element.

2. The drying chamber of claim 1, wherein the mask has mask supports that extend outside the enclosure.

3. The drying chamber of claim 2, wherein the mask supports are located on two opposite sides of the mask.

4. The drying chamber of claim 1, wherein the gas source is coupled to the enclosure at a location that provides a gas flow outside the vapor barrier.

5. The drying chamber of claim 1, wherein the mask includes a wall extending from a proximate surface of the mask toward the support surface.

6. The drying chamber of claim 1, wherein the substrate support includes temperature-control elements.

7. The drying chamber of claim 1, wherein the mask comprises a rigid material disposed over and spaced apart from the substrate.

8. The drying chamber of claim 1, wherein each vapor-transmissive area has a single opening, a plurality of openings, a mesh, a screen, or a porous material.

9. A method for drying a substrate having wet areas wet with a carrier liquid separated by dry boundary regions, the method comprising:
   orienting a mask and a gas distribution element having a vapor barrier relative to the substrate within an enclosure, the mask having vapor-transmissive areas and vapor-barrier regions;
   supporting the mask on movable mask supports located on opposite sides of the mask to vary a gap between the mask and a ceiling of the enclosure;

positioning the vapor barrier to surround a gap between the mask and the gas distribution element; and drawing the carrier liquid from the wet areas of the substrate through the vapor-transmissive areas of the mask using a vacuum port coupled to the ceiling of the enclosure.

10. The method of claim 9, wherein orienting a mask relative to the substrate positions the vapor-transmissive areas opposite the wet areas and the vapor-barrier regions opposite the dry boundary regions.

11. The method of claim 10, further comprising setting a gap between the substrate and the mask.

12. The method of claim 9, wherein the gas distribution element is perforated, and the drawing the carrier liquid from the wet areas of the substrate comprises passing the carrier liquid through the perforated gas-distribution element.

13. The method of claim 12, wherein each of the wet areas are of a first shape and each of the vapor-transmissive areas extend over a similar second shape, the method further comprising aligning the wet areas relative to the vapor-transmissive areas.

* * * * *